(12) United States Patent
Liles

(10) Patent No.: US 8,715,828 B2
(45) Date of Patent: May 6, 2014

(54) EMULSION OF METALLIZED PARTICLES COMPRISING A COMPOUND HAVING A PENDANT SI-H GROUP

(75) Inventor: Donald T. Liles, Midland, MI (US)

(73) Assignee: Dow Corning Corporation, Midland, MI (US)

( * ) Notice: Subject to any disclaimer, the term of this patent is extended or adjusted under 35 U.S.C. 154(b) by 184 days.

(21) Appl. No.: 13/061,242

(22) PCT Filed: Aug. 25, 2009

(86) PCT No.: PCT/US2009/054918
§ 371 (c)(1),
(2), (4) Date: Feb. 28, 2011

(87) PCT Pub. No.: WO2010/025140
PCT Pub. Date: Mar. 4, 2010

(65) Prior Publication Data
US 2011/0171471 A1    Jul. 14, 2011

Related U.S. Application Data

(60) Provisional application No. 61/093,056, filed on Aug. 29, 2008.

(51) Int. Cl.
*B32B 5/16* (2006.01)
*C23C 16/06* (2006.01)
*C23C 18/16* (2006.01)
*C23C 18/52* (2006.01)
*C08K 3/08* (2006.01)
*C08K 5/5415* (2006.01)

(52) U.S. Cl.
CPC .................. *C23C 16/06* (2013.01); *C23C 18/16* (2013.01); *C23C 18/52* (2013.01); *C08K 3/08* (2013.01); *C08K 5/5415* (2013.01)

USPC .......................... 428/402.2; 427/229; 428/405

(58) Field of Classification Search
CPC ........ C08K 3/08; C08K 5/5403; C23C 16/06; C23C 18/16; C23C 18/52
USPC ................... 75/335; 427/229; 428/402.2, 407
See application file for complete search history.

(56) References Cited

U.S. PATENT DOCUMENTS

| 3,433,780 A | 3/1969 | Cekada, Jr. et al. |
| 4,052,430 A | 10/1977 | Yajima et al. |

(Continued)

FOREIGN PATENT DOCUMENTS

| CN | 101006211 A | 7/2007 |
| CN | 101091111 A | 12/2007 |

(Continued)

OTHER PUBLICATIONS

Zoldesi et al, Deformable hollow hybrid silica/siloxane colloids by emulsion templating, Langmuir 22, 4343-4352 (2006).*

(Continued)

*Primary Examiner* — Hoa (Holly) Le
(74) *Attorney, Agent, or Firm* — Howard & Howard Attorneys PLLC

(57) ABSTRACT

A particle is formed from a dispersion and includes a compound and a metal disposed on the particle. The compound has the chemical formula R—Si—H. In this formula, R is an organic or inorganic moiety. The particle is also included in a corresponding dispersion. The particle is formed from a method that includes the step of forming the dispersion. The method also includes the step of disposing the metal on the particle.

16 Claims, 3 Drawing Sheets

(56) References Cited

U.S. PATENT DOCUMENTS

| | | | |
|---|---|---|---|
| 4,704,444 A | 11/1987 | Brown-Wensley et al. | |
| 4,722,988 A | 2/1988 | Porte et al. | |
| 4,857,582 A | 8/1989 | Wolfgruber et al. | |
| 4,935,484 A | 6/1990 | Wolfgruber et al. | |
| 4,938,456 A | 7/1990 | Richards | |
| 5,049,636 A | 9/1991 | Wolfgruber et al. | |
| 5,759,230 A * | 6/1998 | Chow et al. | 75/362 |
| 5,945,158 A | 8/1999 | Djokic et al. | |
| 6,414,078 B1 * | 7/2002 | Fukushima et al. | 524/588 |
| 6,689,468 B2 * | 2/2004 | Edelmann et al. | 428/403 |
| 7,141,518 B2 * | 11/2006 | MacDonald et al. | 442/59 |
| 7,640,789 B2 | 1/2010 | Kim et al. | |
| 7,709,088 B2 | 5/2010 | Nonokawa et al. | |
| 2001/0002275 A1 * | 5/2001 | Oldenburg et al. | 427/214 |
| 2004/0072683 A1 * | 4/2004 | Kodas et al. | 502/224 |
| 2005/0069708 A1 * | 3/2005 | Isarov et al. | 428/405 |
| 2005/0164584 A1 | 7/2005 | Baratian et al. | |
| 2006/0085063 A1 | 4/2006 | Shastri et al. | |
| 2006/0107791 A1 * | 5/2006 | Fujino et al. | 75/365 |
| 2006/0154070 A1 * | 7/2006 | Wakiya et al. | 428/403 |
| 2007/0018361 A1 | 1/2007 | Xu | |
| 2008/0187996 A1 | 8/2008 | Baca et al. | |
| 2010/0013126 A1 | 1/2010 | Ishaque et al. | |
| 2010/0139226 A1 | 6/2010 | Sigmund et al. | |
| 2010/0255745 A1 | 10/2010 | Liles et al. | |
| 2011/0192789 A1 | 8/2011 | Gogotsi et al. | |

FOREIGN PATENT DOCUMENTS

| | | |
|---|---|---|
| CN | 101165083 A | 4/2008 |
| DE | 4214045 A1 | 11/1993 |
| DE | 102006049666 A1 | 4/2008 |
| EP | 0152704 A2 | 8/1985 |
| EP | 1090959 A1 | 4/2001 |
| EP | 1767675 A1 | 3/2007 |
| GB | 2009196 A | 6/1979 |
| JP | 60188429 A | 9/1985 |
| JP | 64-062475 A | 3/1989 |
| JP | 2003-073964 A | 3/2003 |
| JP | 2006-283240 A | 10/2006 |
| JP | 2007-053109 A | 3/2007 |
| JP | 2007528942 A | 10/2007 |
| WO | WO 02-24310 A1 | 3/2002 |
| WO | WO 2005/021845 A1 | 3/2005 |
| WO | WO 2006001403 A1 | 1/2006 |
| WO | WO 2006-017360 A1 | 2/2006 |
| WO | WO 2006/108364 A1 | 10/2006 |
| WO | WO 2007-045616 A1 | 4/2007 |
| WO | WO 2008-010199 A2 | 1/2008 |
| WO | WO 2008-022993 A2 | 2/2008 |
| WO | WO 2008-073662 A1 | 6/2008 |
| WO | WO 2008-112755 A1 | 9/2008 |
| WO | WO 2009-038767 A2 | 3/2009 |
| WO | WO 2009-067230 A1 | 5/2009 |
| WO | WO 2009-074630 A2 | 6/2009 |
| WO | WO 2010-025067 A2 | 3/2010 |
| WO | WO 2010-025381 A2 | 3/2010 |

OTHER PUBLICATIONS

English language abstract for CN 101165083 extracted from espacenet.com database, Jan. 25, 2011, 10 pages.

English language abstract for DE 4214045 extracted from espacenet.com database, Aug. 20, 2010, 11 pages.

English language abstract for DE 102006049666 extracted from espacenet.com database, Jan. 25, 2011, 16 pages.

English language translation and abstract for JP 2003-073964 extracted from PAJ database, Jan. 25, 2011, 61 pages.

English language translation and abstract for JP 2006-283240 extracted from PAJ database, Jan. 25, 2011, 49 pages.

English language abstract for WO 2008-022993 extracted from espacenet.com database, Jan. 25, 2011, 30 pages.

English language abstract for WO 2009-074630 extracted from espacenet.com database, Jan. 25, 2011, 35 pages.

PCT International Search Report for PCT/US2008/012956, dated Feb. 9, 2009, 4 pages.

PCT International Search Report for PCT/US2009/054306, dated Mar. 29, 2010, 3 pages.

PCT International Search Report for PCT/US2009/054918, dated Feb. 24, 2010, 3 pages.

PCT International Search Report for PCT/US2009/055386, dated Jun. 7, 2010, 7 pages.

Article: Dai et al., "A Novel Method for Preparing Ultra-Fine Alumina-Borate Oxide Fibres Via an Electrospinning Technique", Nanotechnology, No. 13, 2002, pp. 674-677.

Article: McCann et al. "Electrospinning of Nanofibers With Core-Sheath, Hollow, or Porous Structures", Journal of Materials Chemistry, No. 15, 2005, pp. 735-738.

Article: Stoiljkovic et al., "Preparation of Water-Satable Submicron Fibers from Aqueous Latex Dispersion . . . ", Science Direct-Polymer, No. 48, 2007, pp. 3974-3981.

Encyclopedia: Wikipedia, "Calcination", extracted from http://en.wikipedia.org/wiki/Calcination, dated May 6, 2010, 2 pages.

Encyclopedia: Wikipedia, "Pyrolysis", extracted from http://en.wikipedia.org/wiki/Pyrolysis, dated May 6, 2010, 8 pages.

English language abstract for CN 101006211 extracted from the espacenet.com database on Jun. 28, 2013, 27 pages.

English language abstract for CN 101091111 extracted from the espacenet.com database on Jun. 28, 2013, 45 pages.

Jong-Min Lim et al., "Fabrication of One-Dimensional Colloidal Assemblies from Electrospun Nanofibers," Langmuir 2006, 22 (8), 3445-3449.

Numata, M. et al., "Beta-1,3-Glucan polysaccharide can act as a one-dimensional host to create novel silica nanofiber structures," Chem. Commun., 2005, 4655-4657.

Sigmund, W. et al., "Processing and Structure Relationships in Electrospinning of Ceramic Fiber Systems," J. Am. Ceram. Soc., 2006, 89 (2), 395-407.

English language abstract not available for JP 60188429; however, see English equivalent EP 0152704. Original document extracted from the espacenet.com database on Apr. 4, 2013, 20 pages.

English language abstract for JP 64-062475 extracted from the PAJ database on Apr. 4, 2013, 14 pages.

English language abstract not available for JP 2007528942; however, see English equivalent WO 2005/021845. Orginal document extracted from the espacenet.com database on Apr. 4, 2013, 17 pages.

English language abstract for WO 2006001403 extracted from the espacenet.com database on Apr. 4, 2013, 37 pages.

Li X.L. et al., "Effiecient Synthesis of Carbon Nanotube-Nanoparticle Hybrids", Advanced Functional Materials, vol. 16, Issue 18, Dec. 2006, pp. 2431-2437.

Pengxiang Hou et al., "Purification of single-walled carbon nanotubes synthesized by the hydrogen arc-discharge method", J. Mater. Res., vol. 16, No. 9, Sep. 2001, pp. 2526-2529.

English language abstract and machine-assisted translation for JP 2007-053109 extracted from the PAJ database on Sep. 13, 2013, 71 pages.

* cited by examiner

US 8,715,828 B2

EMULSION OF METALLIZED PARTICLES COMPRISING A COMPOUND HAVING A PENDANT SI-H GROUP

RELATED APPLICATIONS

This application claims priority to and all the advantages of International Patent Application No. PCT/US2009/054918, filed on Aug. 25, 2009, which claims priority to U.S. Provisional Patent Application No. 61/093,056, filed on Aug. 29, 2008.

FIELD OF THE INVENTION

The present invention generally relates to a particle that is formed from a dispersion and has a metal disposed thereon. More specifically, the particle includes a compound having a particular chemical formula. The present invention also relates to the dispersion and a method of forming the particle.

DESCRIPTION OF THE RELATED ART

Dispersions and particles dispersed within dispersions, i.e., dispersed particles, are known to be useful in plastics, coatings, and cosmetics and can be formed using different production processes known in the art. One type of process, emulsion polymerization, forms particles in an emulsion but has a number of drawbacks. For instance, polymerization in this type of process occurs at an "oil-water" interface. As such, formation of small particles with large surface areas is kinetically favored, thus rendering production of larger particles difficult and energy consuming. Similarly, emulsion polymerization requires a number of expensive processing steps and materials. In one example, emulsion polymerization requires long batch times and caustic materials which must be neutralized. These types of requirements increase production costs which are typically passed along to the end user.

A second type of process for producing dispersions and dispersed particles is mechanical emulsion. In this process, a non-polar compound such as a hydrophobic oil or polymer is typically emulsified with a variety of surfactants and water using mechanical mixers. Although not requiring long processing times, this type of process is limited by shear stress which can be induced by the mechanical mixers and a viscosity of the hydrophobic oil or polymer.

Accordingly, there remains an opportunity to form improved dispersions and particles that are functionalized and that have metals disposed thereon. There also remains an opportunity to develop an improved method of forming such particles both economically and efficiently. There further remains an opportunity to include these particles in a variety of products to improve physical and chemical characteristics.

SUMMARY OF THE INVENTION AND ADVANTAGES

The instant invention provides a particle including a compound having the chemical formula R—Si—H. In this formula, R is an organic or inorganic moiety. The particle also has a metal disposed thereon. The invention also provides a corresponding dispersion. The dispersion includes the particle, which is dispersed in the dispersion, and the metal disposed on the particle. The invention further provides a method of forming the particle. The method includes the step of forming the dispersion and the step of disposing the metal on the particle.

The particle may be effectively utilized to prepare both thermally and electrically conductive components. The particle can also be used in antimicrobial applications, in preservatives, deodorants, wound dressings, and dentifrices, and as a catalyst in organic synthesis reactions. Further, the particle can be used in filters and solar cells. The corresponding dispersion allows the particle to be handled easily and allows for quality checks on the particle to be performed efficiently and accurately. The dispersion also allows for a variety of types of compounds to be utilized to form particles that can be customized based on desired physical and chemical properties. The dispersion can also be effectively utilized in a variety of industries including in cosmetic and coating applications.

BRIEF DESCRIPTION OF THE SEVERAL VIEWS OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
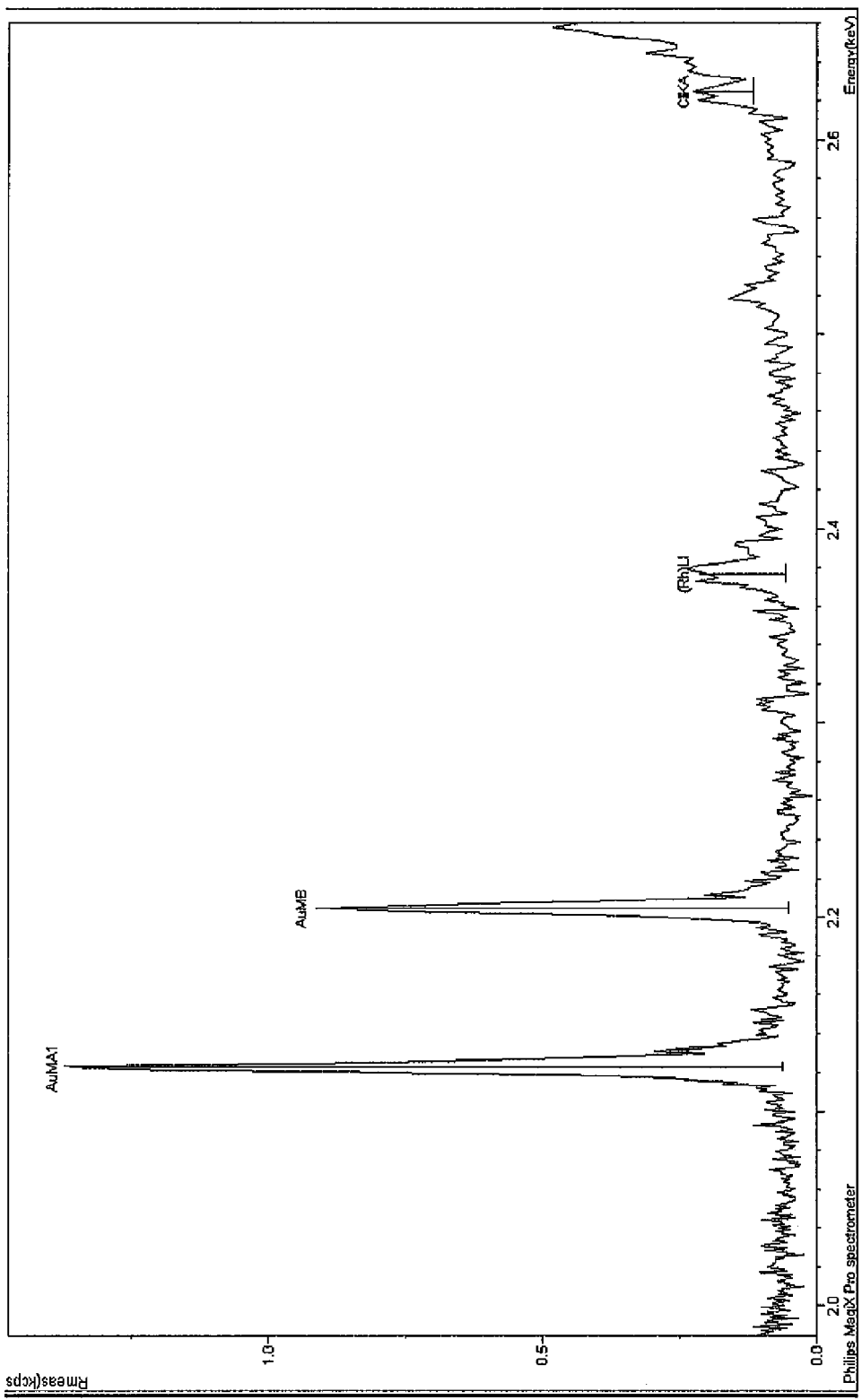
FIG. 1 is an x-ray fluorescence spectrum measuring kilo counts per second as a function of energy (keV) of the Particles 2 of Example 11 and illustrating Au M lines which are indicative of gold disposed on the particles.

The instant invention provides a particle. Of course, it is to be understood that the terminology "particle" may refer to a single particle or a plurality of particles. Thus, the terminology "particle" and "particles" are used interchangeably herein. The instant invention also provides a corresponding dispersion. Typically, the particles are dispersed in the dispersion. In other words, the particles may be "dispersed particles." As is known in the art, dispersions include one phase of matter that is immiscible with, and dispersed in, another phase of matter, i.e., a dispersed phase in a continuous phase. The dispersion may include a liquid, solid, or gas, in addition to the particles. The particles themselves may be solids, liquids, gasses, or combinations thereof and may be dispersed in one or more of the same. The particles are usually liquids or solids that are immiscible with, and dispersed in, a liquid continuous phase. The particles may include liquids as diluents, such that no external or additional liquids are added to the dispersion. Alternatively, the dispersion may include a liquid independent of any diluent.

In one embodiment, the dispersion includes a liquid and the particles are dispersed in the liquid. Alternatively, the liquid may be an external liquid that is added independently of any other component. In one embodiment, the liquid is a non-polar liquid. In another embodiment, the liquid is a polar liquid such as an alcohol or water. Typically, the liquid is water. The water may be tap water, well water, purified water, deionized water, and combinations thereof and may be present in the dispersion in varying amounts depending on the type of dispersion. In one embodiment, the dispersion includes solid particles as the dispersed phase and the liquid as the continuous phase. In another embodiment, the dispersion includes a non-polar liquid (e.g., non-polar liquid particles) as the dispersed phase and a polar liquid as the continuous phase. In various embodiments, the liquid may be present in amounts of from 20 to 80, of from 30 to 70, of from 40 to 60, or in an amount of about 50, parts by weight per 100 parts by weight of the dispersion, so long as a total amount of the dispersion does not exceed 100 parts by weight.

The dispersion may be further defined as a "colloid" or "colloid dispersion," terminology which can be used interchangeably. Typically, colloids include particles of less than 100 nanometers in size dispersed in the continuous phase. Colloids may be classified in numerous ways. For purposes of the instant invention, the colloid may also be classified as a gel (liquid particles as the dispersed phase and a solid continuous phase), an emulsion (liquid particles as the dispersed phase and a liquid continuous phase), and/or a foam (gas particles as the dispersed phase and a liquid continuous phase). The colloid may be reversible (i.e., exist in more than one state) or irreversible. Further, the colloid may be elastomeric or viscoelastic.

The dispersion may be further defined as an emulsion, as first introduced immediately above. As is understood in the art, emulsions are one type of dispersion and are typically classified into one of four categories according to a chemical nature of the dispersed and continuous phases. A first category is an oil-in-water (O/W) emulsion. O/W emulsions typically include a non-polar dispersed phase (e.g., oil) in an aqueous continuous phase (e.g. water) which forms particles. For purposes of the instant invention, the terminology "oil" includes non-polar molecules, may include any non-polar compound, and may include the particles of the invention. A second category of emulsion is a water-in-oil (W/O) emulsion. W/O emulsions typically include a polar dispersed phase such as water or other hydrophilic substances or mixtures thereof in a non-polar continuous phase such as a hydrophobic oil or polymer. A third category is a water-in-oil-in-water (W/O/W) emulsion. These types of emulsions include a polar dispersed phase in a non-polar continuous phase which is, in turn, dispersed in a polar continuous phase. For example, W/O/W emulsions may include water droplets entrapped within larger oil droplets that in turn are dispersed in a continuous water phase. A fourth category is a water-in-water (W/W) emulsion. These types of emulsions include aqueous solvated molecules, e.g., particles of the invention, in a continuous aqueous solution wherein both the aqueous solvated molecules and the continuous aqueous solution include different molecules that are water-soluble. Without intending to be bound by any particular theory, it is believed that the aforementioned types of emulsions depend on hydrogen bonding, pi stacking, and/or salt bridging of both the dispersed and continuous phases. In this invention, the dispersion may be further defined as any one of these four types of emulsions.

As is also known in the art, dispersions are, to a certain degree, unstable. Typically, there are three types of dispersion instability including (i) flocculation, where particles of the dispersed phase form clumps in the continuous phase, (ii) creaming or sedimentation, where the particles of the dispersed phase concentrate respectively towards a top or bottom of the continuous phase, and (iii) breaking and coalescence, where the particles of the dispersed phase coalesce and form a layer of liquid in the continuous phase. The instant dispersion may exhibit one or more of these types of instability.

As is also known in the art, dispersions typically have two different types of viscosities, a total viscosity and a viscosity of the dispersed phase. The dispersion of the instant invention typically has a total viscosity of at least 20 centistokes at a temperature of 25° C. In various embodiments, the dispersion has a viscosity of at least 20 centistokes, more typically from about 30 to about 100 centistokes, most typically from about 40 to about 75 centistokes at a temperature of 25° C. using a Brookfield rotating disc viscometer equipped with a thermal cell and an SC4-31 spindle operated at a constant temperature of 25° C. and a rotational speed of 5 rpm. The viscosity of the dispersed phase is not limited and is not believed to affect the total viscosity. In one embodiment, the dispersed phase is solid and has an infinite viscosity.

Referring specifically to the particles introduced above, the particles may be of varying sizes. In one embodiment, the dispersion includes particles of from 1 nm to 10 µm, more typically of less than 1 µm, even more typically from 1 nm to 1 µm, and most typically of from 100 nm to 1000 nm. In another embodiment, the dispersion may be classified as a nanoemulsion. The dispersion may include particles smaller or larger than the sizes described immediately above, depending on the desire of those of skill in the art. The particles typically have a dynamic viscosity of from $10^5$ to $10^9$ and more typically of from $10^6$ to $10^8$, cP, measured using a rheometer with an oscillation procedure (frequency sweep) of from $10^2$ to $10^{-3}$ Hz. However, the particles can have a dynamic viscosity outside of this range if desired.

The particles include a compound having the chemical formula R—Si—H. In one embodiment, the compound includes a monomer. The monomer may be any organic or inorganic monomer. The monomer may be selected from the group of silanes, siloxanes, and combinations thereof. Alternatively, the monomer may be selected from the group of organosilanes, organosiloxanes, and combinations thereof. In one embodiment, the compound includes a mixture of the monomer having the chemical formula R—Si—H and a polymer. So long as the compound has the chemical formula R—Si—H, the polymer need not include R—Si—H. That is, the monomer or the polymer or both the monomer and polymer may include R—Si—H. The polymer may include the polymerization product of any of the monomers contemplated for use herein. The compound may also include more than one polymer including, but not limited to, organic and inorganic polymers such as polythiophene, polyacetylene, polypyrrole, polyaniline, polysilane, polyvinylidene, polyacrylonitrile, polyvinyl chloride, polymethylmethacrylate, iodine-doped polyacetylene, polyethylene, polypropylene, polystyrene, polyacrylate, polyether, polyester, polycarbonate, polyurethane, polyamide, and combinations thereof. In one embodiment, the compound is further defined as a mixture of the monomer having the chemical formula R—Si—H and the polymer wherein the monomer is dissolved in the polymer. Although the monomer and/or polymer may be present in the compound in any amount, the monomer is typically present in the compound in an amount of less than 25 and most typically in an amount of less than 10, percent by weight.

In the chemical formula R—Si—H, R may be further defined as a polymerization product of at least a first and a second organic monomer. It is to be understood that the first and second organic monomers may include polymerized groups and remain monomers so long as they retain an ability to be polymerized. The first and second organic monomers may be selected from the group of alkylenes, styrenes, acrylates, urethanes, esters, amides, imides, ethylenes, propylenes, carbonates, urethanes, and combinations thereof. Alternatively, the first and second organic monomers may be selected from the group of polyisobutylenes, polyolefins, polystyrenes, polyacrylates, polyurethanes, polyesters, polyamides, polyetherimides, polyethylenes, polypropylenes, polystyrenes, polyethers, polycarbonates, and combinations thereof. In one embodiment, the first and second organic monomers are selected from the group of acrylates, alkenoates, carbonates, phthalates, acetates, itaconates, and combinations thereof. Suitable examples of acrylates include, but are not limited to, alkylhexylacrylates, alkylhexylmethacrylates, methylacrylate, methylmethacrylate, glycidyl acrylate, glycidyl methacrylate, allyl acrylates, allyl methacrylates, and combinations thereof. The first and second organic monomers may include only acrylate or methacrylate functionality. Alternatively, the first and second organic monomers may include both acrylate functionality and methacrylate functionality.

Referring back to the alkenoates introduced immediately above, suitable examples include, but are not limited to, alkyl-N-alkenoates. Suitable examples of carbonates include, but are not limited to, alkyl carbonates, allyl alkyl carbonates, diallyl carbonate, and combinations thereof. Suitable itaconates include, but are not limited to, alkyl itaconates. Non-limiting examples of suitable acetates include alkyl acetates, allyl acetates, allyl acetoacetates, and combinations thereof. Non-limiting of examples of phthalates include, but are not limited to, allyl phthalates, diallyl phthalates, and combinations thereof. Also useful are a class of conductive monomers, dopants, and macromonomers having an average of at least one free radical polymerizable group per molecule and the ability to transport electrons, ions, holes, and/or phonons. It is also contemplated that the first and second organic monomers may include compounds including acryloxyalkyl groups, methacryloxyalkyl groups, and/or unsaturated organic groups including, but not limited to, alkenyl groups having 2-12 carbon atoms, alkynyl groups having 2-12 carbon atoms, and combinations thereof. The unsaturated organic groups may include radical polymerizable groups in oligomeric and/or polymeric polyethers. The first and second organic monomers may also be substituted or unsubstituted, may be saturated or unsaturated, may be linear or branched, and may be alkylated and/or halogenated.

The first and second organic monomers may also be substantially free of silicon (i.e., silicon atoms and/or compounds containing silicon atoms). It is to be understood that the terminology "substantially free" refers to a concentration of silicon of less than 5,000, more typically of less than 900, and most typically of less than 100, parts of compounds that include silicon atoms, per one million parts of the first and/or second organic monomers. It is also contemplated that the first and second organic monomers may be totally free of silicon.

Alternatively, R may be further defined as a polymerization product of at least a silicon monomer and an organic monomer. It is contemplated that the organic monomer and/or silicon monomer may be present in the compound in any volume fraction.

The organic monomer may be any of the aforementioned first and/or second organic monomers or any organic monomer known in the art. The terminology "silicon monomer" includes any monomer that includes at least one silicon (Si) atom such as silanes, siloxanes, silazanes, silicones, silicas, silenes, and combinations thereof. It is to be understood that the silicon monomer may include polymerized groups and remain a silicon monomer so long as it retains an ability to be polymerized. In one embodiment, the silicon monomer is selected from the group of organosilanes, organosiloxanes, and combinations thereof. In another embodiment, the silicon monomer is selected from the group of silanes, siloxanes, and combinations thereof.

The silicon monomer may include acryloxyalkyl- and methacryloxyalkyl-functional silanes also known as acrylic functional silanes, acryloxyalkyl- and methacryloxyalkyl-functional organopolysiloxanes, and combinations thereof. The silicon monomer may also have an average of at least one, or at least two, free radical polymerizable groups and an average of 0.1 to 50 mole percent of the free radical polymerizable groups including unsaturated organic groups. The unsaturated organic groups may include, but are not limited to, alkenyl groups, alkynyl groups, acrylate-functional groups, methacrylate functional groups, and combinations thereof. "Mole percent" of the unsaturated organic groups is defined as a ratio of a number of moles of unsaturated organic groups including siloxane moieties in the silicon monomer to a total number of moles of siloxane moieties in the compound, multiplied by 100. Further, the silicon monomer may include units of the formula $R'SiO_{3/2}$ wherein R' is selected from the group of a hydrogen atom, an organic radical, or a combination thereof with the proviso that the silicon monomer include at least one hydrogen atom. Still further, the silicon monomer may include an organosilane selected from the group of tri-sec butyl silane, tri-butyl silane, and combinations thereof.

The silicon monomer may also include compounds including a functional group incorporated in the free radical polymerizable group. These compounds may be monofunctional or multifunctional with respect to the non-radical reactive functional group and may allow for polymerization of the silicon monomer to linear polymers, branched polymers, copolymers, cross-linked polymers, and combinations thereof. The functional group may include any known in the art used in addition and/or condensation curable compositions.

Alternatively, the silicon monomer may include an organosilane having the general structure:

$$R''_n Si(OR''')_{4-n}$$

wherein n is an integer of less than or equal to 4. Typically at least one of R" and R''' independently includes the free radical polymerizable group. However, R" and/or R''' may include non-free radical polymerizable groups. Each of R" and/or R''' may include a monovalent organic group free of aliphatic unsaturation. R" and/or R''' may each independently include one of a hydrogen atom, a halogen atom, and an organic group including, but not limited to, alkyl groups, haloalkyl groups, aryl groups, haloaryl groups, alkenyl groups, alkynyl groups, acrylate and methacrylate groups. In one embodiment, R" and/or R''' may each independently include linear and branched hydrocarbon moieties including chains of from 1 to 5 ($C_1$-$C_5$) carbon atoms (such as methyl, ethyl, propyl, butyl, isopropyl, pentyl, isobutyl, sec-butyl groups, etc), linear and branched $C_1$-$C_5$ hydrocarbon groups containing carbon and fluorine atoms, aromatic groups including phenyl, naphthyl and fused ring systems, $C_1$-$C_5$ ethers, $C_1$-$C_5$ organohalogens, $C_1$-$C_5$ organoamines, $C_1$-$C_5$ organoalcohols, $C_1$-$C_5$ organoketones, $C_1$-$C_5$ organoaldehydes, $C_1$-$C_5$ organocarboxylic acids, and $C_1$-$C_5$ organoesters. More typically, R" and/or $R^3$ may include, but are not limited to, linear and branched hydrocarbon groups including chains of from 1 to 3 ($C_1$-$C_3$) carbon atoms (such as methyl, ethyl, propyl, and isopropyl groups), linear and branched $C_1$-$C_3$ hydrocarbon groups including carbon and fluorine atoms, phenyl, $C_1$-$C_3$ organohalogens, $C_1$-$C_3$ organoamines, $C_1$-$C_3$ organoalcohols, $C_1$-$C_3$ organoketones, $C_1$-$C_3$ organoaldehydes, and $C_1$-$C_3$ organoesters. In one specific embodiment, R" and/or R''' is independently selected from the group of aromatic groups and $C_1$-$C_3$ hydrocarbon groups. Alternatively, R" and/or R''' may represent the product of a crosslinking reaction, in which case R" and/or R''' may represent a crosslinking group. Alternatively, R" and/or R''' may also each independently include other organic functional groups including, but not limited to, glycidyl groups, amine groups, ether groups, cyanate ester groups, isocyano groups, ester groups, carboxylic acid groups, carboxylate salt groups, succinate groups, anhydride groups, mercapto groups, sulfide groups, azide groups, phosphonate groups, phosphine groups, masked isocyano groups, hydroxyl groups, and combinations thereof. The monovalent organic group typically has from 1 to 20 and more typically from 1 to 10, carbon atoms. The monovalent organic group may include alkyl groups, cycloalkyl groups, aryl groups, and combinations thereof. The monovalent organic group may still further include an alkyloxypoly(oxylalkylene) group, halogen substituted versions thereof, and combinations thereof. Additionally, the monovalent organic group may include a cyanofunctional group, a halogenated hydrocarbon group, a carbazole group, an aliphatic unsaturated group, acrylate groups, methacrylate groups, and combinations thereof.

The silicon monomer may also include, but is not limited to, 3-methacryloxypropyltrimethoxysilane, methacryloxymethyltrimethoxysilane, 3-methacryloxypropyltriethoxysilane, 3-acryloxypropyltrimethoxysilane, acryloxymethyltrimethoxysilane, 3-methacryloxypropyltrimethylsilane, 3-methacryloxypropyldimethylmonomethoxysilane, 3-methacryloxypropylmethyldimethoxysilane, 3-acryloxypropyltriethoxysilane, 3-acryloxypropyldimethylmonomethoxysilane, 3-acryloxylpropyltrimethylsilane, vinyltrimethoxysilane, allyltrimethoxysilane, 1-hexenyltrimethoxysilane, tetra-(allyloxysilane), tetra-(3-butenyl-1-oxy)silane, tri-(3-butenyl-1-oxy)methylsilane, di-(3-butenyl-1-oxy)dimethylsilane, 3-butenyl-1-oxy trimethylsilane, and/or combinations thereof.

The silicon monomer may have a linear, branched, hyperbranched, or resinous structure. The silicon monomer may include at least one of an acrylate group and a methacrylate group. In one embodiment, the silicon monomer includes a compound formed by copolymerizing organic compounds having polymeric backbones with the silicon monomer such that there is an average of at least one free radical polymerizable group per copolymer. Suitable organic compounds include, but are not limited to, hydrocarbon based polymers, polybutadienes, polyisoprenes, polyolefins, polypropylene and polyethylene, polypropylene copolymers, polystyrenes, styrene butadiene, and acrylonitrile butadiene styrene, polyacrylates, polyethers, polyesters, polyamides, polycarbonates, polyimides, polyureas, polymethacrylates, partially fluorinated or perfluorinated polymers, fluorinated rubbers, terminally unsaturated hydrocarbons, olefins, and combinations thereof. The silicon monomer can also include a copolymer including polymers having multiple organic functionality, multiple organopolysiloxane functionality, and combinations of organopolysiloxanes with the organic compounds. The copolymer may include repeating units in a random, grafted, or blocked arrangement.

Further, the silicon monomer may be a liquid, a gum, or a solid, and may have any viscosity. If the silicon monomer is a liquid, the viscosity may be equal to or greater than 0.001 Pa·s at 25° C. If the silicon monomer is a gum or a solid, the gum or solid may become flowable at elevated temperatures or by application of shear.

The silicon monomer may also include a compound having at least one of the following formulae:

(a) $R^1_3SiO(R^1_2SiO)_a(R^1R^2SiO)_bSiR^1_3$;

(b) $R^3_2R^4SiO(R^3_2SiO)_c(R^3R^4SiO)_dSiR^3_2R^4$;

(c) $R^3_2R^4SiO(R^3_2SiO)_c(R^3R^4SiO)_dSiR^3_3$; and (d) combinations thereof.

In Formula (a), a and b are integers and each typically has an average value of less than or equal to 20,000 and b typically has an average value of at least one. Also, $R^1$ typically includes a monovalent organic group such as an acrylic functional group, an alkyl group, an alkenyl group, and alkynyl group, an aromatic group, a cyanoalkyl groups, a halogenated hydrocarbon group, an alkenyloxypoly(oxyalkyene) group, an alkyloxypoly(oxyalkyene) group, a halogen substituted alkyloxypoly(oxyalkyene) group, an alkoxy group, an aminoalkyl group, an epoxyalkyl group, an ester group, a hydroxyl group, an isocyanate group, a carbamate group, an aldehyde group, an anhydride group, a carboxylic acid group, a carbazole group, salts thereof, halogenated derivatives thereof, and combinations thereof. $R^2$ typically includes an unsaturated monovalent organic group. The unsaturated monovalent organic group may include, but is not limited to, alkenyl groups, alkynyl groups, acrylic groups, and combinations thereof.

In Formulae (b) and (c), c and d are integers and each typically has an average value of less than or equal to 20,000. In these formulae, each $R^3$ may independently be the same or may be different from $R^1$. Additionally, each $R^4$ may independently include an unsaturated organic group such as those above.

In yet another embodiment, the silicon monomer may include, but is not limited to, 1,3-bis(methacryloxypropyl) tetramethyldisiloxane, 1,3-bis(acryloxypropyl)tetramethyldisiloxane, 1,3-bis(methacryloxymethyl)tetramethyldisiloxane, 1,3-bis(acryloxymethyl)tetramethyldisiloxane, α,ω-methacryloxymethyldimethylsilyl terminated polydimethylsiloxane, methacryloxypropyl-terminated polydimethylsiloxane, α,ω-acryloxymethyldimethylsilyl terminated polydimethylsiloxane, methacryloxypropyldimethylsilyl terminated polydimethylsiloxane, α,ω-acryloxypropyldimethylsilyl terminated polydimethylsiloxane, pendant acrylate and methacrylate functional polymers such as poly(acryloxypropyl-methylsiloxy) polydimethylsiloxane and poly(methacryloxypropyl-methylsiloxy) polydimethylsiloxane copolymers, telechelic polydimethylsiloxanes having multiple acrylate or methacrylate functional groups, and combinations thereof. Other compounds suitable for use include, but are not limited to, monofunctional methacrylate or methacrylate terminated organopolysiloxanes. The silicon monomer may also include a mixture of liquids differing in degree of functionality and/or free radical polymerizable groups. For example, the silicon monomer may include a tetra-functional telechelic polydimethylsiloxane.

Further, the silicon monomer may include organopolysiloxane resins having the following structures:

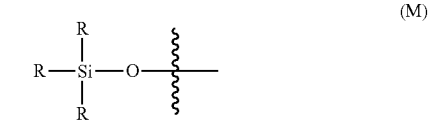

(M)

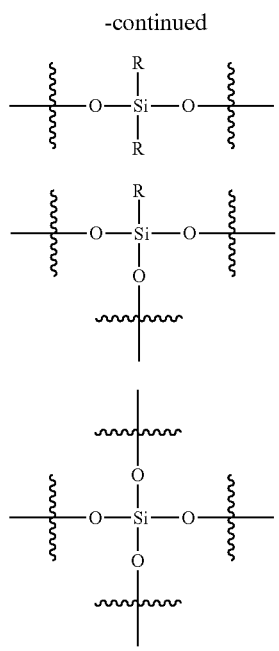

wherein each of M, D, T, and Q independently represent functionality of structural groups of organopolysiloxanes. Specifically, M represents a monofunctional group $R_3SiO_{1/2}$. D represents a difunctional group $R_2SiO_{2/2}$. T represents a trifunctional group $RSiO_{3/2}$. Q represents a tetrafunctional group $SiO_{4/2}$.

If the silicon monomer includes an organopolysiloxane resin, the organopolysiloxane resin may include MQ resins including $R^5_3SiO_{1/2}$ groups and $SiO_{4/2}$ groups, TD resins including $R^5SiO_{3/2}$ groups and $R^5_2SiO_{2/2}$ groups, MT resins including $R^5_3SiO_{1/2}$ groups and $R^5SiO_{3/2}$ groups, MTD resins including $R^5_3SiO_{1/2}$ groups, $R^5SiO_{3/2}$ groups, and $R^5_2SiO_{2/2}$ groups, and combinations thereof.

In these resins, each $R^5$ includes a monovalent organic group. $R^5$ typically has from 1 to 20 and more typically has from 1 to 10, carbon atoms. Suitable examples of the monovalent organic groups include, but are not limited to, those disclosed above relative to R" and R'".

Some specific examples of suitable resins that are useful include, but are not limited to, $M^{Methacryloxymethyl}Q$ resins, $M^{Methacryloxypropyl}Q$ resins, $MT^{Methacryloxymethyl}T$ resins, $MT^{Methacryloxypropyl}T$ resins, $MDT^{Methacryloxymethyl}T^{Phenyl}T$ resins, $MDT^{Methacryloxypropyl}T^{Phenyl}T$ resins $M^{Vinyl}T^{Phenyl}$ resins, $TT^{Methacrylmethyl}$ resins, $TT^{Methacryloxypropyl}$ resins, $T^{Phenyl}T^{Methacryloxymethyl}$ resins, $T^{Phenyl}T^{Methacryloxymethyl}$ resins, $TT^{Phenyl}T^{Methacryloxymethyl}$ resins, and $TT^{Phenyl}T^{Methacryloxymethyl}$ resins, MQ resins, trimethyl capped MQ resins, T (Ph) resins, T propyl/T (Ph) resins, trimethyl capped MQ resins blended with linear silicone, and combinations thereof, where M, D, T, and Q are the same as described above.

In alternative embodiments, R may be further defined as the polymerization product of at least two silicon monomers. In these embodiments, R may substantially free of carbon, i.e., substantially free of the polymerization product of organic monomers. It is to be understood that the terminology "substantially free" refers to a concentration of carbon of less than 5,000, more typically of less than 900, and most typically of less than 100, parts of compounds that include carbon atoms, per one million parts of the compound. It is also contemplated that the silicon monomers may be totally free of carbon. The two silicon monomers may be any of the aforementioned silicon monomers and may be the same or different from each other.

R may include an organopolysiloxane including siloxane units having an average unit formula of $R_xSiO_{y/2}$, i.e., $R^6_xSiO_{y/2}$. In this embodiment, $R^6$ is selected from the group of an inorganic group, an organic group, and combinations thereof, x is from about 0.1 to about 2.2 and y is from about 1.8 to about 3.9. More typically, x is from about 0.1 to about 1.9 and y is from about 2.1 to about 3.9. Most typically, x is from about 0.5 to about 1.5 and y is from about 2.5 to about 3.5. To explain, the above general formula, and values for x and y, represent an average formula of the organopolysiloxane. As such, it is to be appreciated that the above general formula represents organopolysiloxanes that may include M, D, T, and/or Q units, and any combination of such units. As known in the art, M units are represented by the general formula $R_3SiO_{1/2}$, D units are represented by the general formula $R_2SiO_{2/2}$, T units are represented by the general formula $R_1SiO_{3/2}$, and Q units are represented by the general formula $SiO_{4/2}$. With reference to the above more and most typical values for x and y, it is preferred that these embodiments include at least some Q and/or T units, thereby providing that these embodiments have at least a portion of a resinous component (i.e., a branched organopolysiloxane as opposed to pure linear organopolysiloxanes, which includes mainly D units with the backbone capped by M units). In one specific embodiment, the organopolysiloxane includes only T units. In another specific embodiment, the organopolysiloxane includes only M and Q units. In another specific embodiment, the organopolysiloxane includes a physical blend (i.e., non-chemical blend) of a resinous component and a linear component. Of course, it is to be appreciated that the organopolysiloxane, in addition to possibly including any combination of M, D, T, and Q units, may also include any combination of separate components including only M and D units, only M and T units, only M, D, and T units, only M and Q units, only M, D, and Q units, or only M, D, T, and Q units.

In the above general formula, $R^6$ may be selected from the group of oxygen-containing groups, organic groups free of oxygen, and combinations thereof. For example, $R^6$ may comprise a substituent selected from the group of linear or branched $C_1$ to $C_5$ hydrocarbon groups containing a halogen atom. Alternatively, $R^6$ may comprise a substituent selected from the group of linear or branched $C_1$ to $C_5$ hydrocarbon groups optionally including amino groups, alcohol groups, ketone groups, aldehyde groups, ester groups, and/or combinations thereof. Alternatively, $R^6$ may comprise a substituent selected from the group of aromatic groups. Further, $R^6$ may comprise any combination of the above substituents set forth as suitable for $R^6$. For example, the $R^6$ may include, but is not limited to, any of the R' and/or R" groups described above. In one specific embodiment, $R^6$ may represent the product of a crosslinking reaction, in which case $R^6$ may represent a crosslinking group in addition to another polyorganosiloxane chain.

One specific example of an organopolysiloxane that is suitable for purposes of the instant invention includes units having an average unit formula of $R^7SiO_{3/2}$, where $R^7$ is selected from the group of phenyl groups, methyl groups, and combinations thereof. Another specific example of a polyorganosiloxane that is suitable for purposes of the instant invention includes units having an average unit formula of $R^8SiO_{3/2}$, where $R^8$ is selected from the group of phenyl groups, propyl groups, and combinations thereof. Another specific example of a polyorganosiloxane that is suitable for purposes of the instant invention is a trimethyl-capped MQ resin. Yet another specific example of a polyorganosiloxane that is suitable for purposes of the instant invention is a polyorganosiloxane comprising a 4:1 blend, by weight, of trimethyl-capped MQ resin and a linear polysiloxane.

Further, the organopolysiloxane may include an organopolysiloxane having the formula:

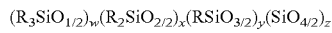
$$(R_3SiO_{1/2})_w(R_2SiO_{2/2})_x(RSiO_{3/2})_y(SiO_{4/2})_z$$

wherein each R is independently selected from the group of an inorganic group, an organic group, and combinations thereof and may be the same or different and may be any of those groups described above or below. Additionally, w is from 0 to about 0.95, x is from 0 to about 0.95, y is from 0 to 1, z is from 0 to about 0.9, and w+x+y+z=1. Alternatively, the organopolysiloxane may include a cured product of the aforementioned organopolysiloxane or a combination of the organopolysiloxane and the cured product. In the above formula, the subscripts w, x, y, and z are mole fractions. The subscript w alternatively has a value of from 0 to about 0.8, alternatively from 0 to about 0.2; the subscript x alternatively has a value of from 0 to about 0.8, alternatively from 0 to about 0.5; the subscript y alternatively has a value of from about 0.3 to 1, alternatively from about 0.5 to 1; the subscript z alternatively has a value of from 0 to about 0.5, alternatively from 0 to about 0.1. In one embodiment, y+z is less than about 0.1, and w and x are each independently greater than 0. In this embodiment, it thus becomes clear that the organopolysiloxane has either no T and/or Q units (in which case the organopolysiloxane is an MD polymer), or has a very low amount of such units. In this embodiment, the organopolysiloxane has a number average molecular weight ($M_n$) of at least about 50,000 g/mol, more typically at least 100,000 g/mol. Of course, it is to be appreciated that in embodiments in which y+z is less than about 0.1, the organopolysiloxane component may require higher $M_n$ values, as set forth above, to achieve desired properties.

Further, R may include a blend of organopolysiloxanes such as organopolysiloxanes that have the formula $(R^9_3SiO_{1/2})_{w'}(R^9_2SiO_{2/2})_{x'}$, wherein $R^9$ is selected from the group of an inorganic group, an organic group, and combinations thereof, w' and x' are independently greater than 0, and w'+x'=1. In effect, this organopolysiloxane is a linear organopolysiloxane. In this formula, w' is typically a number ranging from about 0.003 to about 0.5, more typically from about 0.003 to about 0.05, and x' is typically a number ranging from about 0.5 to about 0.999, more typically from about 0.95 to about 0.999.

The organopolysiloxane may also include crosslinks, in which case a cross-linker of the organopolysiloxane typically has a crosslinkable functional group that may function through known crosslinking mechanisms to crosslink individual polymers within the organopolysiloxane. It is to be appreciated that when the organopolysiloxane includes crosslinks, such crosslinks may be formed prior to, during, or after formation of the particles. As such, the presence of crosslinks in the organopolysiloxane in the particles does not necessarily mean that the particles must be formed from the composition that includes the cross-linker. The cross-linker may include any reactant or combination of reactants that forms the organopolysiloxane and may include, but are not limited to, hydrosilanes, vinylsilanes, alkoxysilanes, halosilanes, silanols, and combinations thereof.

Typically, the compound has a number average molecular weight ($M_n$) such that the compound is not volatile at room temperature and atmospheric pressure. However, the compound is not limited to such a number average molecular weight. In one embodiment, the compound has a number average molecular weight of greater than about 100,000 g/mol. In various other embodiments, the compound has number average molecules weights of from 5,000-20,000, from 100,000-5,000,000, from 100,000-1,000,000, from 100,000-500,000, from 200,000-300,000, of higher than about 250,000, or of about 150,000, g/mol. In one embodiment in which the compound is further defined as the monomer having the chemical formula R—Si—H, the compound has a number average molecular weight of less than 50,000 g/mol. In another embodiment, in which the compound is further defined as the polymer, the compound has a number average molecular weight of greater than 50,000 g/mol, and more typically of greater than 100,000 g/mol. However, the monomer may have a number average molecular weight of greater than 50,000 g/mol and/or the polymer may have a number average molecular weight of less than 100,000 g/mol. Alternatively, the compound may have a number average molecular weight of at least about 300 g/mol, of from about 1,000 to about 2,000 g/mol, or of from about 2,000 g/mol to about 2,000,000 g/mol. In other embodiments, the compound may have a number average molecular weight of greater than 350 g/mol or of from about 5,000 to about 50,000 g/mol.

Referring back to the particles, the particles have a metal disposed thereon. It is to be understood that the terminology "metal" may include elemental metals, metal alloys, metal ions, metal atoms, metal salts, organic metal compounds, metal particles including physically bound collections of metal atoms and chemically bound collections of metal atoms, and combinations thereof. The metal may be any known in the art and may be formed by reaction of its ion with Si—H. In one embodiment, the metal is selected from the group of copper, technetium, ruthenium, rhodium, palladium, silver, rhenium, osmium, iridium, platinum, gold, and combinations thereof. In another embodiment, the metal is selected from the group of gold, silver, platinum, palladium, rhodium, iridium, salts thereof, and combinations thereof. In a further embodiment, the metal is a noble metal. Although a noble metal is typically thought to be mostly unreactive, for purposes of the instant invention, the noble metal may react with the Si—H of the compound. The metal may also be further defined as a salt of a noble metal.

The metal may be disposed on the particles in any manner known in the art. In one embodiment, the metal is physically disposed on the particles. In another embodiment, the metal is bonded to the particles such that the metal is chemically disposed on the particles. In a further embodiment, the metal is agglomerated into metal particles, which are different from the dispersed particles. The metal particles may be nanoparticles, nanopowders, nanoclusters, and/or nanocrystals. Typically, the metal particles have a size of from 1 to 500, more typically of from 2 to 100, and most typically of from 5 to 10, nanometers. As is known in the art, nanoparticles, nanopowders, nanoclusters, and/or nanocrystals include microscopic (metal) particles with at least one dimension less than 100 nm. Without intending to be bound by any particular theory, it is believed that these types of metal particles (e.g. nanoparticles) can have high surface areas which may be important for applications involving catalysis, light capture, and absorption because of increased active areas and greater activities. It is also believed that quantum confinement effects, resulting from the size of the particles, may allow the particles to exhibit unique electrical, optical, and/or magnetic phenomena.

Alternatively, the metals may form a film that is disposed on the particles. The film may be a monolayer film of metal atoms. The metal may be in contact with the particles and not bonded to the particles. Alternatively, the metal may be bonded to the particles. In one embodiment, various metal atoms are in contact with the particle and not bonded to the particle while other atoms are simultaneously bonded to the particle. Typically, the metals are bonded to the particles via a reduction reaction with the Si—H of the compound. Without intending to be bound by any particular theory, it is believed that the Si—H of the compound acts as a reducing agent and reduces the metal (e.g. the metal ion) from a first cationic state to a lower cationic state or to an elemental state (e.g. $M^0$).

The particles may also include an additional metal or metals disposed thereon. The additional metal(s) may be the same or may be different from the (first) metal In one embodiment, the additional metal(s) is selected from the group of copper, technetium, ruthenium, rhodium, palladium, silver, rhenium, osmium, iridium, platinum, gold, and combinations thereof. The additional metal(s) may be bonded to the particles while the (first) metal is not. Alternatively, the additional metal(s) may be in contact with the particle but not bonded to the particles while the (first) metal is bonded to the particles. Both the additional metal(s) and the (first) metal may be bonded to the particles or may both be in contact with the particles but not bonded.

In one embodiment, the particles include the reaction product of the compound and the metal. As set forth above, if the compound reacts with the metal, the metal ions typically react via a reduction reaction with the Si—H of the compound. It is believed that this reduces the metal ions from the first cationic state to the lower cationic state or to the elemental state, as also set forth above. In all of these embodiments, the compound and the metal may be the same as described above.

The dispersion may also include a surfactant. In various embodiments, the dispersion includes the (first) surfactant and a second surfactant or multiple surfactants. The surfactant may be combined with the liquid, such as a polymeric liquid or with any other component, prior to formation of the dispersion. Typically, the surfactant is combined with the polymeric liquid before the dispersion is formed. Surfactants are also known as emulsifiers, emulgents, and tensides. Relative to this invention, the terminology "surfactant", "emulsifier", "emulgent", and "tenside" may be used interchangeably. Surfactants reduce a surface tension of a liquid by adsorbing at a liquid-gas interface. Surfactants also reduce interfacial tension between polar and non-polar molecules by adsorbing at a liquid-liquid interface. Without intending to be bound by any particular theory, it is believed that surfactants act at these interfaces and are dependent on various forces including, excluded volume repulsion forces, electrostatic interaction forces, van der waals forces, entropic forces, and steric forces. In the instant invention, the surfactant may be chosen or manipulated based on one or more of these forces.

The surfactant, first and second surfactants, or first/second/ and multiple surfactants may independently be selected from the group of non-ionic surfactants, cationic surfactants, anionic surfactants, amphoteric surfactants, and combinations thereof. Suitable non-ionic surfactants include, but are not limited to, alkylphenol alkoxylates, ethoxylated and propoxylated fatty alcohols, alkyl polyglucosides and hydroxyalkyl polyglucosides, sorbitan derivatives, N-alkylglucamides, alkylene oxide block copolymers such as block copolymers of ethylene oxide, propylene oxide and/or butylene oxide, polyhydroxy and polyalkoxy fatty acid derivatives, amine oxides, silicone polyethers, various polymeric surfactants based on polysaccharides, polymeric surfactants based on polyvinyl alcohol and polyacrylamide, and combinations thereof.

Suitable cationic surfactants include, but are not limited to, interface-active compounds including ammonium groups such as alkyldimethylammonium halides and compounds having the chemical formula $RR'R''R'''N^+X^-$ wherein R, R', R", and R''' are independently selected from the group of alkyl groups, aryl groups, alkylalkoxy groups, arylalkoxy groups, hydroxyalkyl(alkoxy) groups, and hydroxyaryl(alkoxy) groups and wherein X is an anion.

Suitable anionic surfactants include, but are not limited to, fatty alcohol sulfates and sulfates of ethoxylated fatty alcohols. Further non-limiting examples of suitable anionic surfactants include alkanesulfonates, linear alkylbenzenesulfonates, linear alkyltoluenesulfonates, diphenyl sulfonates, and diphenylether sulfonates. Still further, the anionic surfactant may include olefinsulfonates and di-sulfonates, mixtures of alkene- and hydroxyalkane-sulfonates or di-sulfonates, alkyl ester sulfonates, sulfonated polycarboxylic acids, alkyl glyceryl sulfonates, fatty acid glycerol ester sulfonates, alkylphenol polyglycol ether sulfates, paraffinsulfonates, alkyl phosphates, acyl isothionates, acyl taurates, acyl methyl taurates, alkylsuccinic acids, alkenylsuccinic acids and corresponding esters and amides thereof, alkylsulfosuccinic acids and corresponding amides, mono- and diesters of sulfosuccinic acids, acyl sarcosinates, sulfated alkyl polyglucosides, alkyl polyglycol carboxylates, hydroxyalkyl sarcosinates, and combinations thereof. Still further, polymeric anionic surfactants based on acrylic acid or sulfonated polystyrene, and combinations thereof, may also be used. Suitable ampholytic surfactants include, but are not limited to, aliphatic derivatives of secondary and/or tertiary amines which include an anionic group, betaine derivatives, and combinations thereof.

Additionally, the surfactant and/or first and second surfactants may independently include aliphatic and/or aromatic alkoxylated alcohols, LAS (linear alkyl benzene sulfonates), paraffin sulfonates, FAS (fatty alcohol sulfates), FAES (fatty alcohol ethersulfates), alkylene glycols, trimethylolpropane ethoxylates, glycerol ethoxylates, pentaerythritol ethoxylates, alkoxylates of bisphenol A, and alkoxylates of 4-methylhexanol and 5-methyl-2-propylheptanol, and combinations thereof. Further, the surfactant and/or first and second surfactants may include alkylpolysaccharides including linear or branched alkyl groups, linear or branched alkenyl groups, alkylphenyl groups, alkylene groups, and/or combinations thereof. Typically, the surfactant is present in an amount of from 0.1 to 100, more typically of from 0.01 to 5, even more typically of from 0.5 to 5, and most typically of from 1.5 to 2.5, parts by weight per 100 parts by weight of the dispersion.

The dispersion may also include a thickener. As is known in the art, thickeners increase a viscosity of the dispersion at low shear rates while maintaining flow properties of the dispersion at higher shear rates. Suitable thickeners for use in the instant invention include, but are not limited to, polyalkylene oxides such as polyethylene oxide, polypropylene oxide, polybutylene oxide, and combinations thereof. In one embodiment, the thickener is selected from the group of algenic acid and its derivatives, polyethylene oxide, polyvinyl alcohol, methyl cellulose, hydroxypropylmethyl cellulose, alkyl and hydroxyalkyl cellulose, carboxymethyl cellulose, hydroxyethyl cellulose, guar gum, gum arabic, gum ghatic, polyvinylpyrrolidone, starch, modified starch, tamarind gum, xanthan gum, polyacrylamide, polyacrylic acid, and combinations thereof.

The thickener may be combined with the liquid or any other component, before the dispersion is formed. Typically, the thickener is combined with the liquid before the dispersion is formed. In one embodiment, the thickener is combined with a liquid in which it is not soluble and this mixture is combined with the dispersion after it has been formed. Examples of such liquids include, but are not limited to, propylene glycol, ethylene glycol, glycerin, and combinations thereof. The thickener is typically present in an amount of from 0.001 to 25, more typically of from 0.05 to 5, and most typically of from 0.1 to 0.5, parts by weight per 100 parts by weight of the dispersion.

The dispersion may also include additives. The additives may include, but are not limited to, conductivity-enhancing additives, salts, dyes, perfumes, preservatives, plasticizers, active ingredients, colorants, labeling agents, rust inhibitors, and combinations thereof. In one embodiment, the conductivity-enhancing additive includes an ionic compound. In another embodiment, the conductivity-enhancing additives are generally selected from the group of amines, organic salts and inorganic salts, and mixtures thereof. Typical conductivity-enhancing additives include amines, quaternary ammonium salts, quaternary phosphonium salts, ternary sulfonium salts, and mixtures of inorganic salts with organic ligands. More typical conductivity-enhancing additives include quaternary ammonium-based organic salts including, but not limited to, tetrabutylammonium chloride, tetrabutylammonium bromide, tetrabutylammonium iodide, phenyltrimethylammonium chloride, phenyltriethylammonium chloride, phenyltrimethylammonium bromide, phenyltrimethylammonium iodide, dodecyltrimethylammonium chloride, dodecyltrimethylammonium bromide, dodecyltrimethylammonium iodide, tetradecyltrimethylammonium chloride, tetradecyltrimethylammonium bromide, tetradecyltrimethylammonium iodide, hexadecyltrimethylammonium chloride, hexadecyltrimethylammonium bromide, and hexadecyltrimethylammonium iodide. The additive may be present in either the continuous or dispersed phase of the dispersion in any amount selected by one of skill in the art. In various embodiments, the amount of the additive is typically of from about 0.0001 to about 25%, more typically from about 0.001 to about 10%, and more typically from about 0.01 to about 1% based on the total weight of the particles.

The present invention also provides a method of forming the particles. The method includes the step of forming the dispersion. The dispersion may be formed by any suitable means known in the art and typically includes combining a liquid continuous phase with an immiscible dispersed phase. The liquid continuous phase may be any described above. The immiscible dispersed phase typically includes the particles of the invention. Alternatively, the immiscible dispersed phase may include the compound having the chemical formula R—Si—H.

The step of forming the dispersion may include emulsifying the compound and/or particles and the liquid. The step of combining may form the dispersion but may not form the particles. The compound, particles, and/or liquid may be combined in any order. The surfactant and/or thickener may be added to the liquid prior to, concurrent with, or after combination with the compound and/or particles.

In one embodiment, the dispersion is formed by simple agitation to form a coarse water in oil mixture. This mixture is then emulsified. During emulsification, the coarse water in oil mixture is inverted into a fine silicone in water emulsion. The emulsification can be accomplished by conventional methods such as with ribbon mixers, plow mixers, fluidizing paddle mixers, sigma blade mixers, tumble blenders, vortex mixers, feed mixers, vertical mixers, horizontal mixers, and combinations thereof.

The method also includes the step of disposing the metal on the particle. The step of disposing may occur by any method known in the art. In one embodiment, the step of disposing includes contacting the metal and the particle. In another embodiment, the step of disposing includes reacting the metal with the Si—H of the compound. In yet another embodiment, the step of disposing is further defined as reacting the Si—H of the compound with the metal via a reduction reaction. The method may also include the step of disposing the additional metal(s) on the particles.

It is contemplated that the method may also include the step of immersing the particle in a solution comprising the metal. The solution may be the dispersion or may be a separate liquid or solution. The solution may be an aqueous solution or a non-polar solution. In one embodiment, the metal is added to the solution as a metal salt which may include, but is not limited to, halide salts such as chlorides and salts of the chemical formulas: $[X^+][Y^+][Z^-]$ or $[Y^+][Z^-]$, wherein X may be a metal, hydrogen atom, or cation producing species, Y is the metal of the instant invention, and Z is an anion producing species. In each of these salts, the charges of X and Y and Z should balance to zero. Specific examples of such salts include $AuCl_3$, $PtCl_2$, $PdCl_2$, $RhCl_3$, $IrCl_3.xH_2O$, $NaAuCl_4$, $HAuCl_4$, $KPtCl_6$, $AgNO_3$, $Ag(OCOR)$ wherein R is an alkyl or aryl group, $CuX$ or $CuX_2$ wherein X is a halogen, $Cu(OOCR)_2$ wherein R is an alkyl or aryl group, and combinations thereof.

The dispersions of the instant invention are useful in most known applications for silicone emulsions, for example in personal care applications such as on hair, skin, mucous membrane or teeth. In many of these applications, the dispersion is lubricious and improves properties of skin creams, skin care lotions, moisturizers, facial treatments such as acne or wrinkle removers, personal and facial cleansers, bath oils, perfumes, fragrances, colognes, sachets, sunscreens, pre-shave and after shave lotions, shaving soaps and shaving lathers. The dispersion can likewise be used in hair shampoos, hair conditioners, hair sprays, mousses, permanents, depilatories, and cuticle coats, for example to provide styling and conditioning benefits. In cosmetics, the dispersion may function as a leveling and spreading agent for pigment in make-ups, color cosmetics, foundations, blushes, lipsticks, eye liners, mascaras, oil removers, color cosmetic removers and powders. The dispersion may also be useful as a delivery system for oil and water soluble substances such as vitamins, organic sunscreens, ceramides, pharmaceuticals and the like. When compounded into sticks, gels, lotions aerosols and roll-ons, the dispersion may impart a dry silky-smooth payout. The dispersion may also be mixed with deposition polymers, surfactants, detergents, antibacterials, anti-dandruffs, foam boosters, proteins, moisturizing agents, suspending agents, opacifiers, perfumes, coloring agents, plant extracts, polymers, and other conventional care ingredients. In one embodiment, the dispersion is included in a water based composition that is selected from the group of cosmetic compositions, coating compositions, and combinations thereof. The dispersion may be used in personal care products in amounts of from 0.01 to about 50, and more typically in amounts of from 0.1 to 25, weight percent of a personal care product.

The dispersion may also be useful for numerous other applications such as textile fiber treatment, leather lubrication, fabric softening, release agents, water based coatings, oil drag reduction, particularly in crude oil pipelines, lubrication, facilitation of cutting cellulose materials, and in many other areas where silicones are conventionally used. The dispersion may also be used to reduce oil drag.

Further, the dispersion can be effectively utilized to prepare both thermally and electrically conductive components. The dispersion can also be used in antimicrobial applications, in preservatives, deodorants, wound dressings, and dentifrices, and as a catalyst in organic synthesis reactions. Further, the dispersion can be used in filters and solar cells. The dispersion also allows the particles to be handled easily and allows for quality checks on the particles to be performed efficiently and accurately. The dispersion also allows for a variety of types of compounds to be utilized to form particles that can be customized based on desired physical and chemical properties. The dispersion can also be effectively utilized in a variety of industries including in cosmetic and coating applications.

EXAMPLES

A series of particles (Particles 1-6) and dispersions (Dispersions 1-9) are formed according to the instant invention. More specifically, the Particles 1-6 are extracted from various dispersions, dried, and evaluated to determine an amount of metal disposed on the particles. The Dispersions 1-9 are formed and evaluated to determine mean particle size.

Example 1

Preparation of Dispersion 1

To prepare Dispersion 1, 50 g of a trimethylsiloxy terminated copolymer including dimethylsiloxane units and methylhydrogensiloxane units, having a weight percent of hydrogen of 0.163 (SiH), and a kinematic viscosity of approximately 290 centistokes, is loaded into a 100 g SpeedMixer® Max 100 cup followed by 1.87 g of 1,4-hexadiene and 0.05 g of a Pt divinytetramethylsiloxane complex (catalyst) in a vinyldimethylsiloxy-terminated dimethylsiloxane fluid having a kinematic viscosity of 450 centistokes and a Pt content of 0.5 weight percent. The cup is closed and spun for 20 seconds in a SpeedMixer® DAC 150. 0.75 g of polyoxyethylene (4) lauryl ether (commercially available under the trade name of Brij® 30), 1.25 g of a 72% aqueous solution of polyoxyethylene (23) lauryl ether (commercially available under the trade name of Brij® 35L) and 7.5 g DI water are then loaded, in order, into the cup. The cup is closed and spun in 2×20 second cycles while the interior walls of the cup are scraped with a spatula between the cycles. A viscous white liquid forms after the first cycle and is characterized as an o/w emulsion. The emulsion is then diluted with an initial aliquot of 5 g of DI water and is spun for one 20 second cycle. This is followed by successively diluting the emulsion with additional aliquots of water that increase in size by about 1.5 times of the original 5 g and spinning the cup between each dilution until a total of 32.8 g of DI water has been added. The emulsion is then heated inside a 50° C. oven for two hours and allowed to cool to room temperature. The emulsion is then visually evaluated and determined to be a nonionic, o/w emulsion including elastomeric particles dispersed in water. The dispersed particles include a polydimethylsiloxane elastomer having silicon hydride functionality. Mean particle size is measured using a Malvern Mastersizer® particle size analyzer and determined to be 12.6 μm with approximately 90% of the particles having a particle size less than 23.0 μm. The emulsion has a non-volatile content of approximately 55% by weight, as determined by methods well known in the art.

Example 2

Preparation of Dispersion 2

To prepare Dispersion 2, 50 g of a trimethylsiloxy terminated copolymer including dimethylsiloxane units and methylhydrogensiloxane units, having a weight percent of hydrogen of 0.163 (SiH), and having a kinematic viscosity of approximately 290 centistokes, is loaded into a 100 g SpeedMixer® Max 100 cup followed by 1.87 g of hexadiene and 0.05 g of a Pt divinytetramethylsiloxane complex (catalyst) in a vinyldimethylsiloxy-terminated dimethylsiloxane fluid having a kinematic viscosity of 450 centistokes and a Pt content of 0.5 weight percent. The cup is closed and spun for 20 seconds in a SpeedMixer® DAC 150. 1.3 g of a 72% aqueous solution of polyoxyethylene (23) lauryl ether (commercially available under the trade name of Brij® 35L) and 6.12 g DI water are then loaded, in order, into the cup. The cup is closed and spun in 2×20 second cycles while the interior walls of the cup are scraped with a spatula between each cycle. After spinning, an inverted emulsion, which has the appearance of a viscous white liquid, is formed and then diluted successively with aliquots of water (5 g, 10 g, 11 g & 8 g) while spinning the cup for 12 seconds between each dilution. The diluted emulsion is placed into a 50° C. oven for one hour. The emulsion is then visually evaluated and determined to be an o/w aqueous emulsion of silicone elastomer particles having a solids content of approximately 55% by weight. The mean particle size is approximately 10.3 μm with 90% of the particles being less than 17 μm as determined with a Malvern Mastersizer® particle size analyzer.

Example 3

Preparation of Dispersion 3

To prepare Dispersion 3, a solution is formed by mixing 1 g dodecylbenzene sulfonic acid with 359 g deionized water in a 500ml round plastic jar. The jar and solution are rolled for 15 minutes using a jar roller. A solution of 6.53 g of methyldimethoxysilane and 33.47 g of methyltrimethoxysilane is first prepared and then added to the jar, which is rolled for 20 hours under ambient laboratory conditions. After rolling, a dispersion forms which has the appearance of a slightly opaque liquid. The dispersion is then transferred to a glass jar equipped with a stirrer and neutralized to a pH of approximately 5 by drop wise addition of a 25% solution of triethanolamine. The dispersion is then transferred to a round bottom flask and methanol is removed by vacuum stripping at 50° C. using a laboratory rotary evaporator. After stripping, the dispersion is evaluated to gravimetrically determine percents solids by using a 50° C. oven to evaporate volatile components such as water. Dispersion 3 includes approximately 6% by weight of particles including a copolymeric silicone resin including $(CH_3SiO_{3/2})_m$ $(CH_3HSiO)_n$ units whereby n/m is approximately 0.25. The mean particle size is approximately 33 nm with approximately 90% of the particles having a size of less than 109 nm, as determined by light scattering using a Nanotrac® particle size analyzer.

Example 4

Preparation of Dispersion 4

To prepare Dispersion 4, 2.40 g of dodecylbenzene sulfonic acid is added to 701.6 g of deionized water in a 1000 ml jar. A solution of 16.62 g of $(CH_3)_3SiOSi(CH_3)_3$ in 47.34 g $Si(OEt)_4$ is then prepared and divided into two equal parts, a first part and a second part. The first part is added to the jar. The jar is then capped, shaken, and rolled for 2.5 hours. Subsequently, the second part is added to the jar. The jar is then shaken and rolled for an additional 2.5 hours. After rolling, a solution of 6.87 g of $H(CH_3)_2SiOSi(CH_3)_2H$ in 23.69 g Si(OEt)$_4$ is added to the jar, which is then rolled for an additional 16 hours. The jar is removed from the roller, the contents of the jar are stirred using a mechanical stirrer, and a dispersion is formed. After formation, the dispersion is neutralized to pH of approximately 5 by the drop wise addition of 25% N(EtOH)$_3$ in water with stirring. Approximately 6.2 g of 25% N(EtOH)$_3$ is added to neutralize the dispersion. Ethanol is removed from the dispersion by vacuum stripping using a rotary evaporator. After stripping, a nonvolatile content of the dispersion is determined gravimetrically using a 50° C. oven to evaporate water from the dispersion. The dispersion includes approximately 6% by weight of particles including M and Q units in a ratio of about 0.9. Approximately ⅓ of the M units include H(CH$_3$)$_2$SiO$_{1/2}$ while the remaining M units include (CH$_3$)$_3$SiO$_{1/2}$. Mean particle size of the dispersion is measured using a Nanotrac® particle size analyzer and is determined to be about 48 nm with 90% of the particles having a size of less than 76 nm.

Example 5

Preparation of Dispersion 5

To prepare Dispersion 5, 10 g of the dispersion described in Example 3 is loaded into a 30 ml vial. Three drops of colorless 10% AgNO$_3$ solution (0.18 g total) is added to the dispersion, which is also colorless. Upon addition, the dispersion turns extremely dark. This color is homogeneously dispersed throughout the dispersion and minimal or no settling or precipitation occurs. Without intending to be bound by any particular theory, it is believed that the color change results from formation of silver nanoparticles. The mean particle size is approximately 33 nm with approximately 90% of the particles having a size of less than 109 nm, as determined by light scattering using a Nanotrac® particle size analyzer.

Example 6

Preparation of Dispersion 6

To prepare Dispersion 6, 10 g of the dispersion described in Example 3 is loaded into a 30 ml vial, Four drops of 0.2% AuCl$_3$ solution (0.19 g total) is then added to the dispersion. The dispersion turns a pale yellow color upon addition of the AuCl$_3$ solution. Within about five minutes, the appearance of the dispersion becomes a light crimson color, similar in color to commercially available colloidal Au. Evaporation of the colloid leaves a mud-cracked cake-like residue that has a pale pink color. Without intending to be bound by any particular theory, it is believed that the color change results from formation of gold nanoparticles. The mean particle size is approximately 33 nm with approximately 90% of the particles having a size of less than 109 nm, as determined by light scattering using a Nanotrac® particle size analyzer.

Example 7

Preparation of Dispersion 7

To prepare the Dispersion 7, 5 g of the dispersion described in Example 4 is loaded into a 30 ml vial. 0.2 g of 1% by weight solution of Cu(NO$_3$)$_2$.3H$_2$O is then added to the vial, which is shaken. No color change is apparent in the dispersion until about 30 minutes pass after which time the colloid dispersion gradually begins to turn a pale golden brown. The color keeps changing until after about one hour it has the appearance of light copper. No visible precipitate can be seen in the dispersion or the bottom of the vial. Without intending to be bound by any particular theory, it is believed that the color change results from formation of copper nanoparticles. Mean particle size of the dispersion is measured using a Nanotrac® particle size analyzer and is determined to be about 48 nm with 90% of the particles having a size of less than 76 nm.

Example 8

Preparation of Dispersion 8

To prepare the Dispersion 8, 10 g of the dispersion described in Example 3 is loaded into a 30 ml vial. Four drops of an approximately 1% aqueous solution of H$_2$PtCl$_6$ solution is then added to the vial, which is shaken. After shaking, no color change is visible for over two hours. After 16 hours, the colloid dispersion turns a dark color. A small amount of a fine black precipitate is visible on the bottom of the vial. Without intending to be bound by any particular theory, it is believed that the color change results from formation of finely divided platinum nanoparticles. The mean particle size is approximately 33 nm with approximately 90% of the particles having a size of less than 109 nm, as determined by light scattering using a Nanotrac® particle size analyzer.

Example 9

Preparation of Dispersion 9

To prepare Dispersion 9, 50 g of a trimethylsiloxy terminated copolymer having dimethylsiloxane units and methylhydrogensiloxane units, a weight percent of hydrogen of 0.163 (SiH), and a kinematic viscosity of approximately 290 centistokes is loaded into a 100 g SpeedMixer® Max 100 cup followed by 1.87 g of 1,4-hexadiene and 0.05 g of a Pt divinytetramethylsiloxane complex (catalyst) in a vinyldimethylsiloxy-terminated dimethylsiloxane fluid having a kinematic viscosity of 450 centistokes and a Pt content of 0.5 weight percent. The cup is closed and spun for 20 seconds in a SpeedMixer® DAC 150. 0.85 g of a 60% by weight mixture of sodium secondary alkane sulfonate in water (Hostapur® SAS-60) is weighed into the cup followed by 5 g of DI water. The cup is closed and spun in 2×20 second cycles while the interior walls of the cup are scraped with a spatula between the cycles. A viscous white liquid forms after the first cycle and is characterized as an o/w emulsion. The emulsion is then diluted with an initial aliquot of 5 g of DI water and is spun for one 20 second cycle. This is followed by successively diluting the emulsion with additional aliquots of water that increase in size by about 1.5 times of the original 5 g and spinning the cup between each dilution until a total of 57.5 g of DI water is added. The emulsion is then heated inside a 50° C. oven for one hour and allowed to cool to room temperature. The emulsion is then visually evaluated and determined to be an anionic, o/w emulsion including elastomeric particles dispersed in water. The dispersed particles include a polydimethylsiloxane elastomer having silicon hydride functionality. Mean particle size is measured using a Malvern Mastersizer® particle size analyzer and determined to be 10.23 μm with approximately 90% of the particles having a particle size less than 18.45 μm. The emulsion has a non-volatile content of approximately 45% by weight, as determined by evaporating the water and weighing the non-volatile portion of the emulsion.

Example 10

Preparation of Particles 1

To prepare Particles 1, 10 g of the dispersion described in Example 1 is loaded into a Max 20 g cup in addition to 0.42 g of a 2.0% by weight solution of $AuCl_3$. The cup is placed into a SpeedMixer® DAC 150 mixer and spun at maximum speed for 12 seconds. The appearance of the dispersion changes from an opaque white liquid, before addition of the $AuCl_3$, to a yellow opaque liquid. Thirty minutes later, the dispersion changes in color to crimson. The water of the dispersion is then evaporated which forms a pale crimson cake, which is pulverized into a powder. The powder includes silicone elastomer particles which have a mean particle size of approximately 12 µm and have a calculated value of 0.1 weight percent gold disposed on the particles. The mean particle size of the particles is determined by light scattering using a Nanotec® laser light scattering instrument.

Example 11

Preparation of Particles 2

Figure 2:
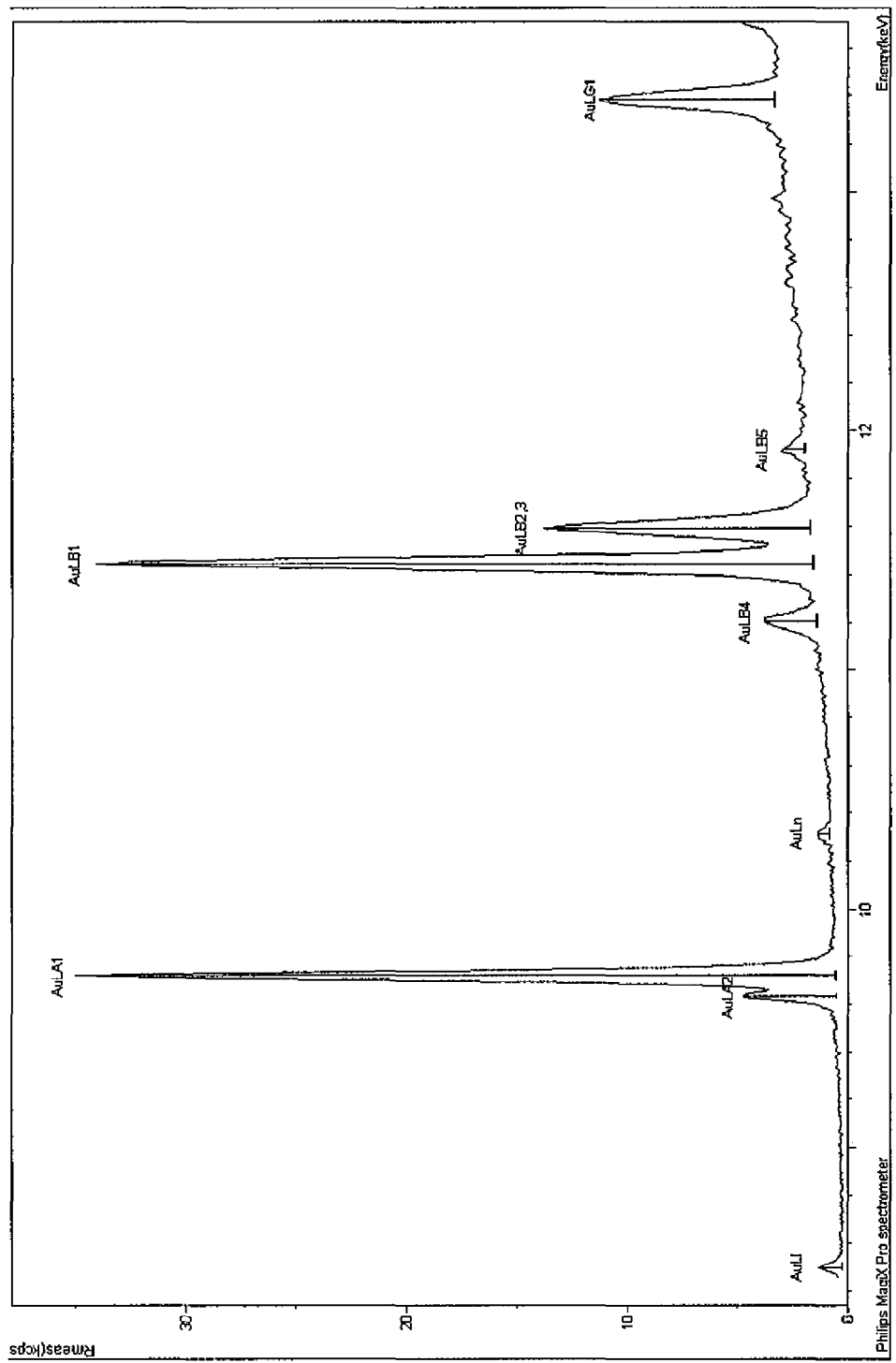
FIG. 2 is an x-ray fluorescence spectrum measuring kilo counts per second as a function of energy (keV) of the Particles 2 of Example 11 and illustrating Au L lines which are indicative of gold disposed on the particles.

To prepare Particles 2, 1.63 g of a 2.0 weight percent solution of $AuCl_3$ is added to 10 g of the dispersion described in Example 2. The same procedure described immediately above relative to the preparation of Particles 1 is the followed. The powder includes silicone elastomer particles which have a mean particle size of approximately 10.3 µm with 90% of the particles being less than 17 µm as determined with a Malvern Mastersizer® particle size analyzer. The particles also have a calculated amount of 0.38% by weight of gold disposed thereon. After formation, the particles are analyzed using x-ray fluorescence spectroscopy and a Phillips MagiX Pro x-ray spectrometer and found to include 0.253 percent by weight Au and less than 25 parts per million of chloride, as set forth in FIGS. 1 and 2 (wherein the Rh line is from the X-Ray tube and not the sample).

Example 12

Preparation of Particles 3

To prepare Particles 3, 10 g of the dispersion described in Example 2 is loaded into a Max 20 cup with 2.0 g of a 0.5% aqueous solution of $NaHCO_3$ and 2.03 g of a 2.0% by weight aqueous solution of $AgCl_3$. The cup is closed and spun for 15 seconds in a SpeedMixer® DAC 150 mixer. The appearance of the dispersion changes from an opaque white to an opaque dark color shortly after addition of the $AgCl_3$ solution and mixing. After remaining undisturbed for three days, the dispersion appears to coagulate and change in color to a brownish, olive green. Water in the dispersion is allowed to evaporate in a 50° C. oven for one hour and the dispersion forms a light brown cake, which is pulverized into a powder. The powder includes silicone elastomer particles having a mean particle size of approximately 10 µm and a calculated amount of 0.47% by weight of silver disposed thereon.

Example 13

Preparation of Particles 4

To prepare Particles 4, 15 g of the dispersion described in Example 4 is allowed to stand in ambient laboratory conditions to evaporate water and form a clear film that mud-cracks into pieces having dimensions of approximately 2 mm×5 mm×0.5 mm thick. Approximately 10 pieces of the film are placed into a sufficient amount of DI water to cover. Subsequently, several drops of 0.5% by weight of an $AgNO_3$ solution and several drops of 0.5% by weight of a $NaHCO_3$ solution are then added to the water. The pieces of the film change in color from colorless to light brown, over a time of approximately 20 hours. Mean particle size of the Particles 4 is measured using a Nanotrac® particle size analyzer and is determined to be about 48 nm with 90% of the particles having a size of less than 76 nm.

Example 14

Preparation of Particles 5

To prepare Particles 5, the same procedure described immediately above relative to Example 11 is used. More specifically, 15 g of the dispersion described in Example 4 is allowed to stand in ambient laboratory conditions to evaporate water and form a clear film that mud-cracks into pieces having dimensions of approximately 2 mm×5 mm×0.5 mm thick. Approximately 10 pieces of the film are placed into a sufficient amount of DI water to cover. Subsequently, one drop of 2% by weight of an $AuCl_3$ is added to the water. The pieces of the film change in color from colorless to crimson, over a time of approximately 20 hours. Mean particle size of the Particles 5 is measured using a Nanotrac® particle size analyzer and is determined to be about 48 nm with 90% of the particles having a size of less than 76 nm.

Example 15

Preparation of Particles 6

Figure 3:
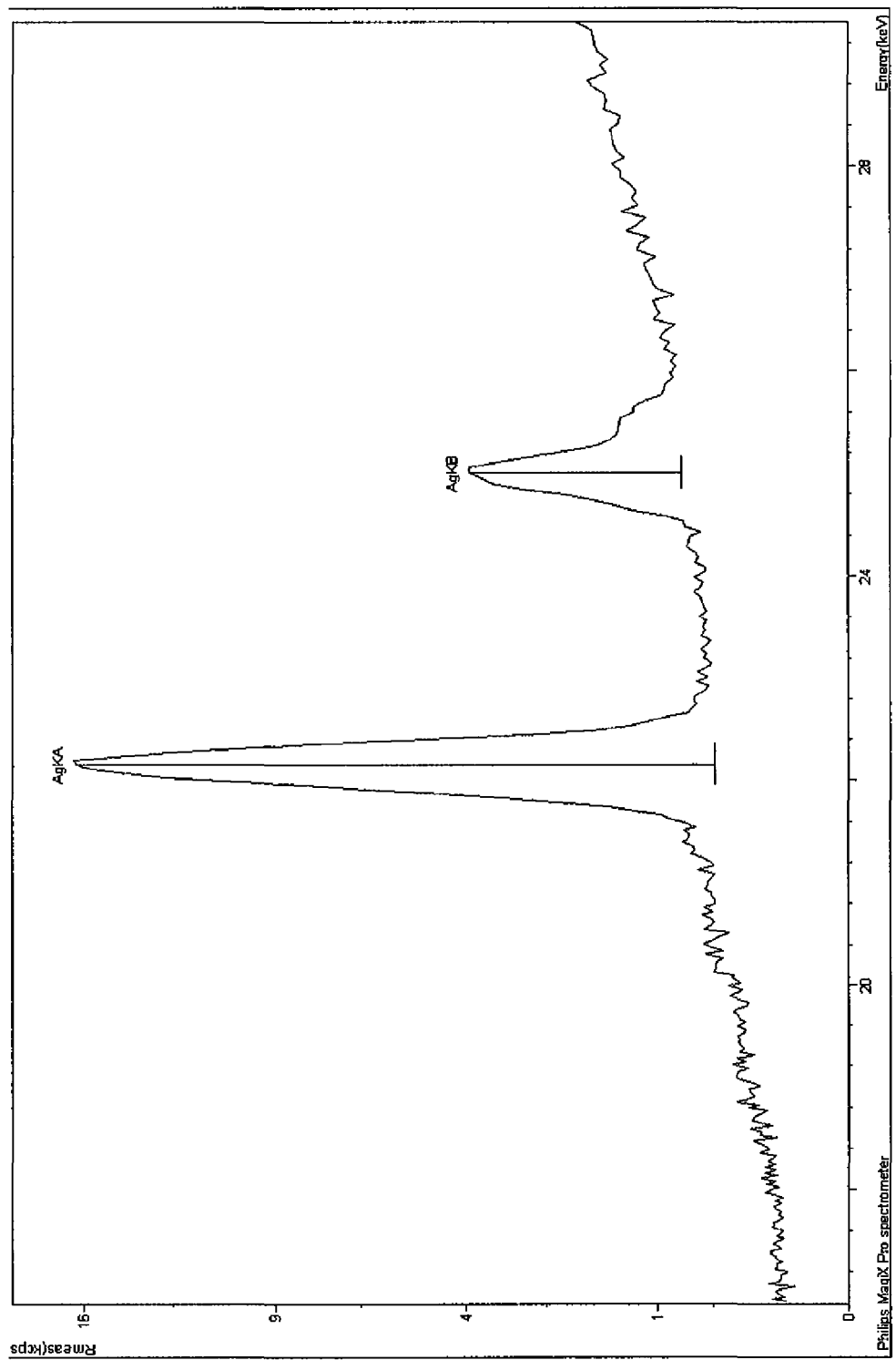
FIG. 3 is an x-ray fluorescence spectrum measuring kilo counts per second as a function of energy (keV) of the Particles 6 of Example 15 and illustrating Ag K lines which are indicative of silver disposed on the particles.

To prepare Particles 6, 10.16 g of a 10 percent by weight aqueous solution of $AgNO_3$ is added to the dispersion from Example 9 (i.e., Dispersion 9) to form a mixture. The mixture is shaken periodically by hand over a period of approximately 30 minutes. The mixture turns a dark cream color within several minutes after addition of the $AgNO_3$. During shaking, the mixture becomes thick and is diluted with three aliquots of 10 g each DI water during the 30 minute shaking period. The mixture is then allowed to stand undisturbed for three days at ambient laboratory conditions. After three days, particles are separated from liquid by vacuum filtration using a laboratory filter apparatus. The particles are dried at ambient laboratory temperature for 24 hours followed by two hours in a 50° C. oven. The particles include spherical silicone elastomer particles having a diameter of about 10 mm and a theoretical level of approximately 0.3% Ag disposed on their surfaces. The particles are analyzed using x-ray fluorescence spectroscopy and a Phillips MagiX Pro x-ray spectrometer and Ag is detected at an approximate level of 0.16 percent by weight. As set forth in FIG. 3, Ag K lines are observed using x-ray fluorescence. Mean particle size is measured using a Malvern Mastersizer® particle size analyzer and determined to be 10.23 µm with approximately 90% of the particles having a particle size less than 18.45 µm.

As the data above shows, particles of the instant invention having a metal disposed thereon are successfully formed from dispersions according to this invention. More specifically, it is believed that the R—Si—H acts as a reducing agent and reduces the metal salts thereby depositing elemental metal on the surface of the particles.

The invention has been described in an illustrative manner, and it is to be understood that the terminology which has been used is intended to be in the nature of words of description rather than of limitation. Many modifications and variations of the present invention are possible in light of the above teachings, and the invention may be practiced otherwise than as specifically described.

What is claimed is:

1. An emulsion comprising a continuous phase and a particle dispersed in the continuous phase, having a metal disposed thereon, and comprising a compound having a pendant Si—H group,
   wherein a portion of a total amount of said compound has a pendant Si—OH group that is formed from a reduction reaction between the Si—H pendant group and said metal such that said metal is disposed on said particle via the reduction reaction, and
   wherein the particle is a liquid.

2. An emulsion as set forth in claim 1 wherein said metal is agglomerated into nanoparticles.

3. An emulsion as set forth in claim 1 wherein said metal forms a film disposed on said particle.

4. An emulsion as set forth in claim 1 wherein said metal is selected from the group of copper, technetium, ruthenium, rhodium, palladium, silver, rhenium, osmium, iridium, platinum, gold, and combinations thereof.

5. An emulsion as set forth in claim 1 wherein said compound is selected from an elastomer or a resin.

6. An emulsion as set forth in claim 1 wherein said compound is further defined as a monomer.

7. An emulsion as set forth in claim 6 wherein said monomer is selected from the group of silanes, Si—H functional siloxanes, and combinations thereof.

8. An emulsion as set forth in claim 1 wherein said compound is R and R is further defined as a polymerization product of at least a first and a second organic monomer.

9. An emulsion as set forth in claim 1 wherein said compound is R and R is substantially free of silicon.

10. An emulsion as set forth in claim 1 wherein said compound is R and R is further defined as a polymerization product of at least a silicon monomer and an organic monomer.

11. An emulsion as set forth in claim 10 wherein said silicon monomer is selected from the group of organosilanes, Si—H functional organosiloxanes, and combinations thereof.

12. An emulsion as set forth in claim 1 wherein said compound is R and R includes an organopolysiloxane comprising siloxane units having an average unit formula of $R_x SiO_{y/2}$, wherein R of said siloxane units is an organic group, x is a number of from 0.1 to 2.2, and y is a number of from 1.8 to 3.9.

13. An emulsion as set forth in claim 12 wherein R of said siloxane units has from one to three carbon atoms and at least one functional moiety selected from the group of halogens, aromatics, amines, alcohols, ketones, aldehydes, esters, and combinations thereof.

14. An emulsion as set forth in claim 1 wherein said compound is R and R is further defined as a polymerization product of at least two silicon monomers.

15. An emulsion as set forth in claim 14 wherein said at least two silicon monomers are independently selected from the group of organosilanes, Si—H functional organosiloxanes, and combinations thereof.

16. An emulsion as set forth in claim 1 wherein said compound is R and R is substantially free of carbon.

* * * * *